United States Patent
Ibraheem et al.

(10) Patent No.: US 9,633,155 B1
(45) Date of Patent: Apr. 25, 2017

(54) CIRCUIT MODIFICATION

(71) Applicant: International Business Machines Corporation, Armonk, NY (US)

(72) Inventors: Wesam Ibraheem, Massade (IL); Tom Kolan, Haifa (IL); Anatoly Koyfman, Kiriat Yam (IL); Ronny Morad, Kiriat Ata (IL); Vitali Sokhin, Haifa (IL); Elena Tsanko, Haifa (IL)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/936,690

(22) Filed: Nov. 10, 2015

(51) Int. Cl.
| G06F 17/50 | (2006.01) |
| G06F 9/44 | (2006.01) |
| G06F 13/10 | (2006.01) |
| G06F 11/00 | (2006.01) |
| G01R 31/28 | (2006.01) |

(Continued)

(52) U.S. Cl.
CPC ...... G06F 17/5045 (2013.01); G06F 12/1027 (2013.01); *G01R 27/28* (2013.01); *G01R 31/14* (2013.01); *G01R 31/28* (2013.01); *G06F 9/44* (2013.01); *G06F 9/455* (2013.01); *G06F 11/00* (2013.01); *G06F 13/10* (2013.01); *G06F 17/30312* (2013.01); *G06F 17/5022* (2013.01); *G06F 2212/68* (2013.01)

(58) Field of Classification Search
CPC ............ G06F 17/5045; G06F 17/5022; G06F 17/30312; G06F 2212/68; G06F 9/44; G06F 9/455; G06F 13/10; G06F 11/00; G06F 12/1027; G01R 31/28; G01R 31/00; G01R 31/14; G01R 27/28

USPC ............. 716/107, 112, 126; 703/16, 20, 26; 702/58, 117; 714/724, 738, 742, 743, 29, 714/32, 42
See application file for complete search history.

(56) References Cited

U.S. PATENT DOCUMENTS

| 4,228,496 A * | 10/1980 | Katzman ............. G06F 12/1458 700/82 |
| 4,670,881 A * | 6/1987 | Imoto ................ G11B 20/1809 386/272 |

(Continued)

OTHER PUBLICATIONS

Allon Adir et al., "A Unified Methodology for Pre-Silicon Verification and Post-Silicon Validation", Design, Automation & Test in Europe Conference & Exhibition (DATE), pp. 1-6 Mar. 14-18, 2011.

*Primary Examiner* — Phallaka Kik

(57) ABSTRACT

Techniques for modifying a circuit are described herein. In some examples, a method includes generating a set of testing data and detecting a predetermined modification to a translation path corresponding to a memory address mapping, the predetermined modification to change a physical memory address of the testing data associated with a virtual memory address to a second physical memory address of the testing data. The method can also include generating a test template comprising a first instruction to implement the predetermined modification and a second instruction comprising the second physical memory address in the translation path and transmitting the test template to the circuit for each of a plurality of software instruction threads. Furthermore, the method can include detecting a defect in the execution of the test template by the circuit and modifying the circuit to prevent the defect during execution of the test template.

20 Claims, 5 Drawing Sheets

(51) Int. Cl.
*G01R 27/28* (2006.01)
*G06F 12/1027* (2016.01)
*G06F 17/30* (2006.01)
*G01R 31/14* (2006.01)
*G06F 9/455* (2006.01)

(56) References Cited

U.S. PATENT DOCUMENTS

| | | | | |
|---|---|---|---|---|
| 4,899,275 A * | 2/1990 | Sachs | ............... | G06F 9/3802 |
| | | | | 711/128 |
| 5,893,152 A * | 4/1999 | Fuller | ............... | G06F 11/141 |
| | | | | 711/141 |
| 6,108,797 A * | 8/2000 | Lin | ............... | G06F 9/445 |
| | | | | 714/35 |
| 7,251,744 B1 * | 7/2007 | Housty | ............... | G06F 11/2284 |
| | | | | 714/36 |
| 7,992,059 B2 | 8/2011 | Anvekar et al. | | |
| 8,245,164 B2 | 8/2012 | Katz et al. | | |
| 8,370,705 B1 * | 2/2013 | Yu | ............... | H03M 13/09 |
| | | | | 714/758 |
| 8,892,386 B2 | 11/2014 | Adir et al. | | |
| 9,384,088 B1 * | 7/2016 | Jones | ............... | G06F 11/1064 |
| 2007/0150659 A1 * | 6/2007 | Arimilli | ............... | G06F 9/30032 |
| | | | | 711/137 |
| 2008/0216073 A1 * | 9/2008 | Yates | ............... | G06F 9/30174 |
| | | | | 718/100 |
| 2009/0138754 A1 * | 5/2009 | Edwards | ............... | G06F 9/4403 |
| | | | | 714/6.11 |
| 2011/0219208 A1 * | 9/2011 | Asaad | ............... | G06F 15/76 |
| | | | | 712/12 |
| 2012/0246387 A1 * | 9/2012 | Kanno | ............... | G06F 11/1016 |
| | | | | 711/103 |
| 2013/0276056 A1 * | 10/2013 | Epstein | ............... | G06F 21/604 |
| | | | | 726/1 |
| 2013/0339654 A1 | 12/2013 | Bybell et al. | | |
| 2015/0278110 A1 * | 10/2015 | Gschwind | ............... | G06F 13/1663 |
| | | | | 711/137 |
| 2015/0370558 A1 * | 12/2015 | Gschwind | ............... | G06F 8/443 |
| | | | | 712/225 |

* cited by examiner

300

400

CIRCUIT MODIFICATION

BACKGROUND

The present disclosure relates to circuits, and more specifically, but not exclusively, to modifying a circuit.

SUMMARY

According to an embodiment described herein, a system for modifying a circuit can include a processor to generate a set of testing data, wherein the set of testing data comprises at least a first virtual memory address corresponding to a first set of tables and a first physical memory address, and a second virtual memory address corresponding to a second set of tables and a second physical memory address. The processor can also detect a predetermined modification to a translation path corresponding to a memory address mapping, the predetermined modification to change the first physical memory address associated with the first virtual memory address to the second physical memory address. The processor can also generate a test template comprising a first instruction to implement the predetermined modification and a second instruction comprising the second physical memory address in the translation path. Furthermore, the processor can transmit the test template to the circuit for each of a plurality of software instruction threads and detect a defect in the execution of the test template by the circuit. Additionally, the processor can modify the circuit to prevent the defect during execution of the test template.

According to another embodiment, a method for modifying a circuit can include generating a set of testing data, wherein the set of testing data comprises at least a first virtual memory address corresponding to a first set of tables and a first physical memory address, and a second virtual memory address corresponding to a second set of tables and a second physical memory address. The method can also include detecting a predetermined modification to a translation path corresponding to a memory address mapping, the predetermined modification to change the first physical memory address associated with the first virtual memory address to the second physical memory address. Furthermore, the method can include generating a test template comprising a first instruction to implement the predetermined modification and a second instruction comprising the second physical memory address in the translation path. Additionally, the method can include transmitting the test template to the circuit for each of a plurality of software instruction threads and detecting a defect in the execution of the test template by the circuit. Moreover, the method can include modifying the circuit to prevent the defect during execution of the test template.

According to another embodiment, a computer program product for modifying a circuit can include a computer readable storage medium having program instructions embodied therewith, wherein the computer readable storage medium is not a transitory signal per se. The program instructions can be executable by a processor to cause the processor to generate a set of testing data, the set of testing data comprising at least a first virtual memory address corresponding to a first set of tables and a first physical memory address, and a second virtual memory address corresponding to a second set of tables and a second physical memory address. Additionally, the program instructions can be executable by a processor to cause the processor to detect a predetermined modification to a translation path corresponding to a memory address mapping, the predetermined modification to change the first physical memory address associated with the first physical memory address to the second physical memory address. Furthermore, the program instructions can be executable by a processor to cause the processor to generate a test template comprising a first instruction to implement the predetermined modification and a second instruction comprising the second physical memory address in the translation path and transmit the test template to the circuit for each of a plurality of software instruction threads. Moreover, the program instructions can be executable by a processor to cause the processor to detect a defect in the execution of the test template by the circuit and modify the circuit to prevent the defect during execution of the test template.

DETAILED DESCRIPTION

Various techniques can be used to test and modify circuits and circuit designs. For example, the testing process can include stimulating a circuit design, detecting erroneous behavior, detecting a root cause of erroneous behavior, and determining a modification to the circuit or circuit design that prevents the erroneous behavior from occurring. In some examples, techniques include generating applications that can modify or translate a memory path used to access data. The modification to the memory path can be generated offline in some examples.

The techniques described herein identify defects in circuits and circuit designs by generating modifications to translation paths that the circuits use to access data. A translation path, as referred to herein, includes any number of mappings from any number of tables to retrieve data stored at a physical memory address. For example, data stored in some physical memory addresses can be retrieved through various memory tables that map a first virtual memory address to a second memory address. In some embodiments, the techniques described herein can enable the modification of a table so that a virtual memory address points to an alternate table or alternate physical memory address. The techniques described herein can also enable a modification of properties of the translation path. For example, the tables in the translation path may include any number of pages of virtual memory addresses and the tables may map virtual addresses according to caching properties. In some examples, these properties of the translation paths can be modified. The modifications to the translation paths can identify defects or unexpected behavior in the execution of instructions by a circuit being tested. In some examples, the modifications to the translation paths can be generated offline prior to executing a test on a circuit. In some embodiments, the techniques described herein can reduce the amount of time to test a circuit and result in a circuit or circuit design that is free from defects.

Figure 1:
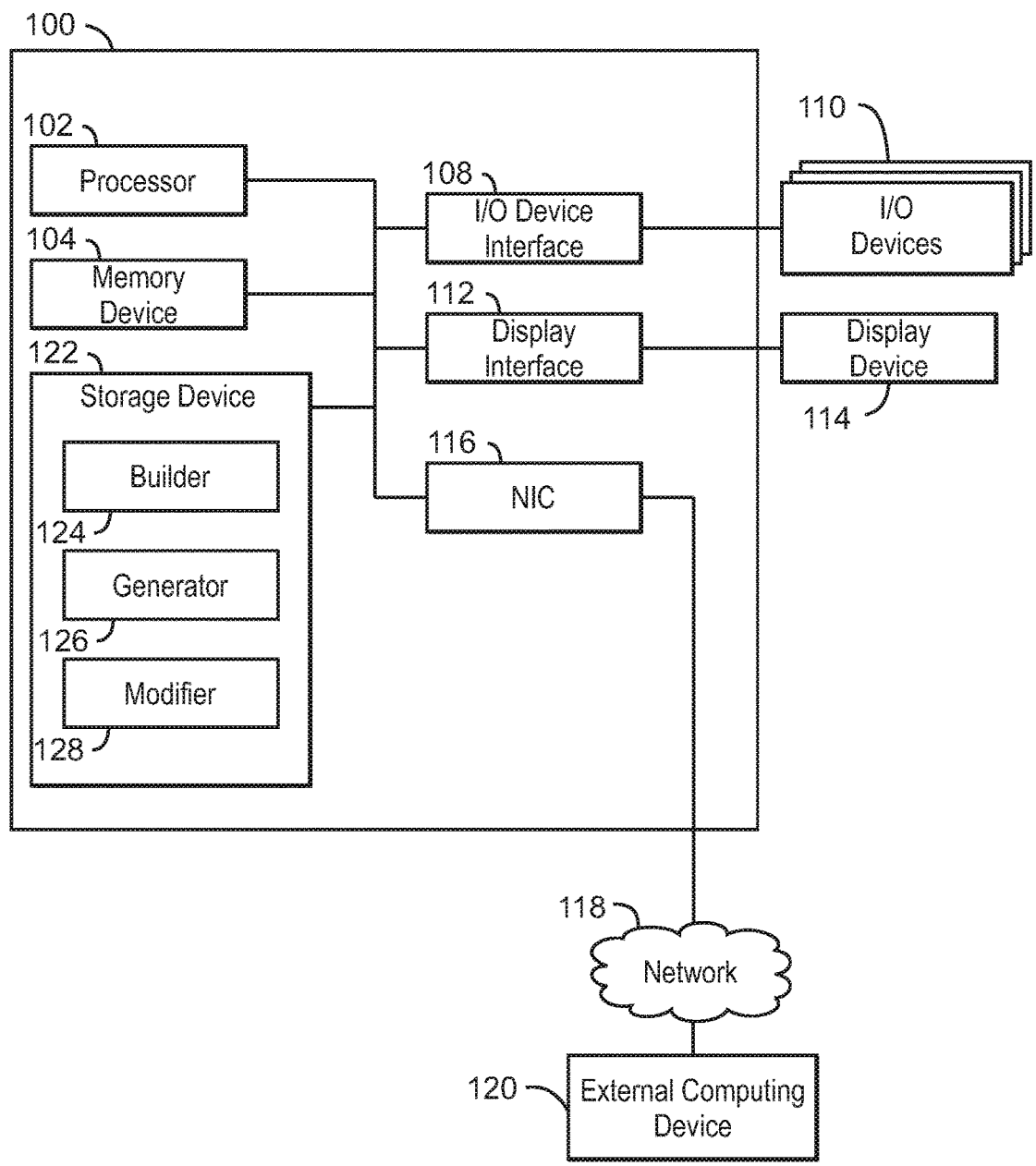
FIG. 1 depicts a block diagram of an example computing system that can modify a circuit according to an embodiment described herein.

With reference now to FIG. 1, an example computing device is depicted that can modify a circuit. The computing device 100 may be for example, a server, desktop computer, laptop computer, tablet computer, or smartphone. In some examples, computing device 100 may be a cloud computing node. Computing device 100 may be described in the general context of computer system executable instructions, such as program modules, being executed by a computer system. Generally, program modules may include routines, programs, objects, components, logic, data structures, and so on that perform particular tasks or implement particular abstract data types. Computing device 100 may be practiced in distributed cloud computing environments where tasks are performed by remote processing devices that are linked through a communications network. In a distributed cloud computing environment, program modules may be located in both local and remote computer system storage media including memory storage devices.

The computing device 100 may include a processor 102 that is adapted to execute stored instructions, a memory device 104 to provide temporary memory space for operations of said instructions during operation. The processor can be a single-core processor, multi-core processor, computing cluster, or any number of other configurations. The memory 104 can include random access memory (RAM), read only memory, flash memory, or any other suitable memory systems.

The processor 102 may be connected through a system interconnect 106 (e.g., PCI®, PCI-Express®, etc.) to an input/output (I/O) device interface 108 adapted to connect the computing device 100 to one or more I/O devices 110. The I/O devices 110 may include, for example, a keyboard and a pointing device, wherein the pointing device may include a touchpad or a touchscreen, among others. The I/O devices 110 may be built-in components of the computing device 100, or may be devices that are externally connected to the computing device 100.

The processor 102 may also be linked through the system interconnect 106 to a display interface 112 adapted to connect the computing device 100 to a display device 114. The display device 114 may include a display screen that is a built-in component of the computing device 100. The display device 114 may also include a computer monitor, television, or projector, among others, that is externally connected to the computing device 100. In addition, a network interface controller (NIC) 116 may be adapted to connect the computing device 100 through the system interconnect 106 to the network 118. In some embodiments, the NIC 116 can transmit data using any suitable interface or protocol, such as the internet small computer system interface, among others. The network 118 may be a cellular network, a radio network, a wide area network (WAN), a local area network (LAN), or the Internet, among others. An external computing device 120 may connect to the computing device 100 through the network 118. In some examples, external computing device 120 may be an external web-server 120. In some examples, external computing device 120 may be a cloud computing node.

The processor 102 may also be linked through the system interconnect 106 to a storage device 122 that can include a hard drive, an optical drive, a USB flash drive, an array of drives, or any combinations thereof. In some examples, the storage device may include a builder 124, a generator 126, and a modifier 128. The builder 124, generator 126, and modifier 128 together can detect defects in circuits or circuit designs based on test templates and modify the circuits or circuit designs. In some embodiments, the builder 124 can generate a set of testing data, wherein the set of testing data comprises at least a first virtual memory address corresponding to a first set of tables and a first physical memory address, and a second virtual memory address corresponding to a second set of tables and a second physical memory address. The builder 124 can also detect a predetermined modification to a translation path corresponding to a memory address mapping. Mapping, or memory address mapping, as referred to herein, includes detecting or generating pointers from one virtual memory address to a second virtual memory address or physical memory address. In some embodiments, the predetermined modification can change a first physical memory address mapped to, or associated with, a first virtual memory address to a second physical memory address. For example, a translation path may include a table with a first virtual memory address that maps or links to a physical memory address. The translation path may be modified to include an alternate table with a second virtual memory address that maps to the physical memory address. Furthermore, in some examples, the properties of the translation path can be modified. This is discussed in greater detail below in relation to FIGS. 2-4.

In some embodiments, the generator 126 can generate a test template comprising a first instruction to implement the predetermined modification of a translation path and a second instruction comprising an alternate or second physical memory address in the translation path. For example, the first instruction can modify a table in the translation path and the second instruction can include a request for data stored in the physical memory address referenced by the modified table. The generator 126 can also transmit the test template to a circuit for each of a plurality of software instruction threads. For example, any number of software instruction threads can modify translation paths in order to search for and identify defects in a circuit.

In some embodiments, the modifier 128 can detect a defect in the execution of the test template by the circuit. For example, the modifier 128 can detect that the modified translation path does not return the correct or expected data from a physical memory address. In some embodiments, the modifier 128 can modify the circuit to prevent the defect during execution of the test template. For example, the modifier 128 can modify a circuit or circuit design so that a modified translation path accesses data from the correct physical memory address. This is discussed in greater detail below in relation to FIG. 2.

It is to be understood that the block diagram of FIG. 1 is not intended to indicate that the computing device 100 is to include all of the components shown in FIG. 1. Rather, the computing device 100 can include fewer or additional components not illustrated in FIG. 1 (e.g., additional memory components, embedded controllers, modules, additional network interfaces, etc.). Furthermore, any of the functionalities of the builder 124, generator 126, and modifier 128 may be partially, or entirely, implemented in hardware and/or in the processor 102. For example, the functionality may be implemented with an application specific integrated circuit, logic implemented in an embedded controller, or in logic implemented in the processor 102, among others. In some embodiments, the functionalities of the builder 124, generator 126, and modifier 128, can be implemented with logic, wherein the logic, as referred to herein, can include any suitable hardware (e.g., a processor, among others), software (e.g., an application, among others), firmware, or any suitable combination of hardware, software, and firmware.

Figure 2:
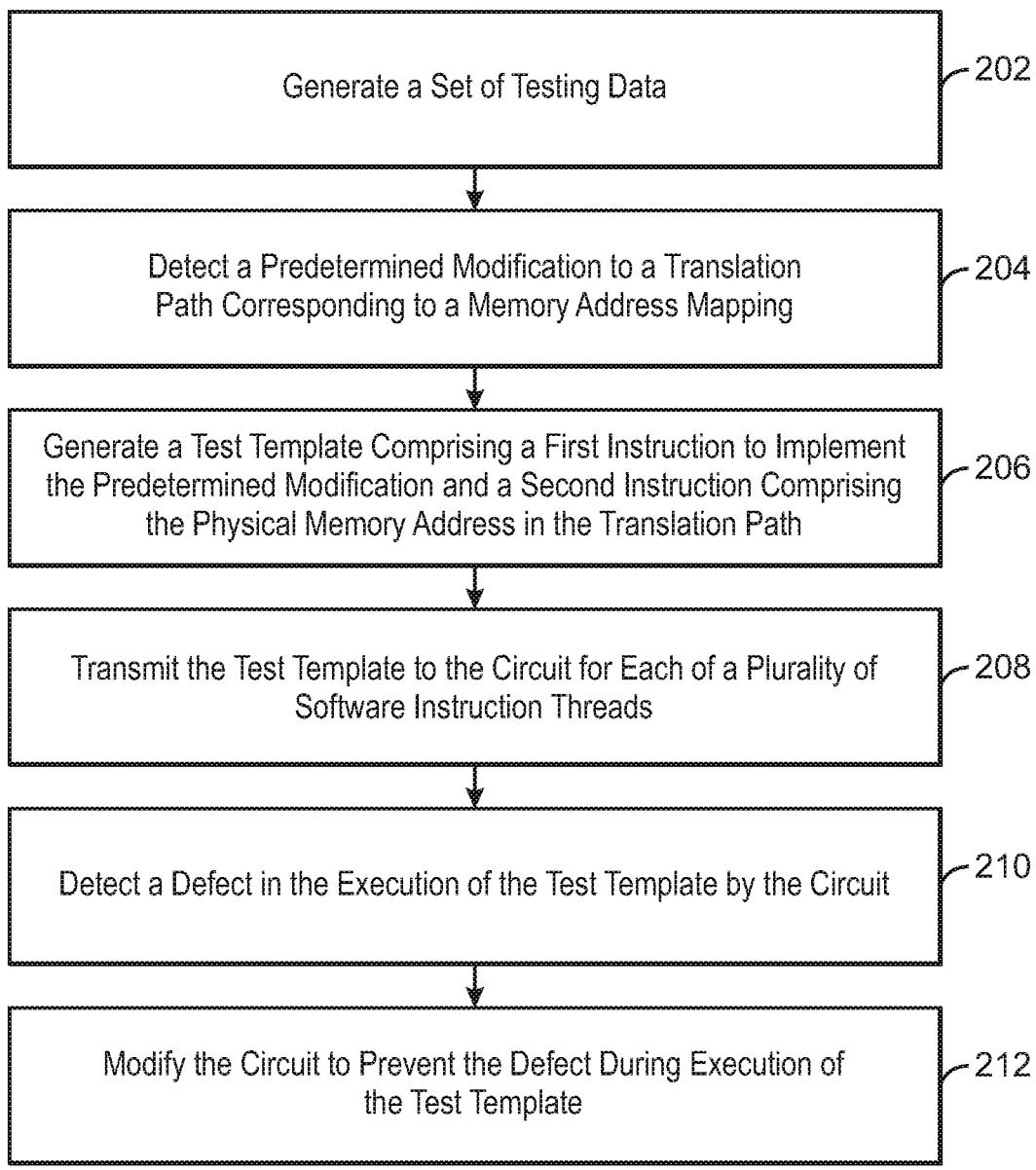
FIG. 2 is a process flow diagram of an example method that can modify a circuit according to an embodiment described herein.

FIG. 2 is a process flow diagram of an example method that can modify a circuit. The method 200 can be implemented with any suitable computing device, such as the computing device 100 of FIG. 1.

At block 202, a builder 124 can generate a set of testing data, wherein the set of testing data comprises at least a first virtual memory address corresponding to a first set of tables and a first physical memory address, and a second virtual memory address corresponding to a second set of tables and a second physical memory address. For example, the builder 124 can generate a first virtual memory address that maps to a first physical memory address through any suitable number of tables. In some embodiments, the builder 124 can also generate a second virtual memory address that maps to a second physical memory address through a separate set of tables. This is described in greater detail below in relation to FIG. 4.

At block 204, a builder 124 can detect a predetermined modification to a translation path corresponding to a memory address mapping. A translation path, as discussed above, can include any number of mappings from any number of tables to retrieve data stored at a physical memory address. In some embodiments, the translation path can also include a mapping from a range of virtual memory addresses to a range of physical memory addresses. In some examples, the translation path includes a number of tables that can map a virtual memory address to a physical memory address.

The predetermined modification can change a first virtual memory address associated with a first physical memory address to a second physical memory address. In some examples, a range of virtual memory addresses can be modified to map to an alternate or new range of physical memory addresses. The range of virtual memory addresses linked to a range of physical memory addresses can correspond to a mapping stored in a translation look aside buffer. In some examples, the predetermined modification can also include changes to the properties of the translation path. For example, the properties of the translation path, such as the size of tables that store virtual memory addresses, can be modified. In some embodiments, modifying properties of the translation path can include modifying a page size or a caching property, or any other suitable characteristic of a translation path.

At block 206, the generator 126 can generate a test template comprising a first instruction to implement the predetermined modification and a second instruction comprising the physical memory address in the translation path. In some embodiments, the first instruction is executed prior to the second instruction. The first instruction can modify the translation paths used by a system to access data stored at one or more physical memory addresses. The modification can be implemented in accordance with the various techniques outlined above in relation to block 204.

In some embodiments, the second instruction generated by the generator 126 can include any suitable operation that requests data from a physical memory address corresponding to the modified translation path. For example, the second instruction can include a read or write instruction, among others, that requests data stored in the physical memory address corresponding to the modified translation path. In some examples, the physical memory address corresponding to the modified translation path can be accessed via a different table in the modified translation path, accessed via a different virtual memory address via the modified translation path, or the physical memory address may correspond to an alternate physical memory address. The alternate physical memory address may be a new physical memory address that is mapped or linked to an existing virtual memory address. In some examples, the generator 126 can randomly generate any number of instructions for the test template and detect a location in the test template to insert the first instruction and the second instruction. For example, the generator 126 can detect a predetermined location to insert the first instruction and the second instruction in the test template. In some examples, the predetermined location to insert the first instruction and the second instruction can be included in a statement within the test template.

At block 208, the generator 126 can transmit the test template to a circuit for each of a plurality of software instruction threads. In some embodiments, transmitting the test template to a circuit is simulated by an application that transmits the test template to a verification or simulation program for a circuit model. The test template, as referred to herein, can include any suitable number of modifications to translation paths corresponding to any number of physical memory addresses. The test template can also include any number of instructions that can be executed following the modifications to the translation paths, wherein the instructions verify that the modified translation paths retrieve the expected values. In some embodiments, the instruction of the test template that modified a translation path can be an atomic instruction that includes a semaphore or lock. The semaphore or lock can prevent other threads from accessing a translation path as the translation path is modified. In some embodiments, each thread executing the test template can, during a locked phase, invalidate translation entries in existing tables in translation paths in memory and cache devices, select new modified translation paths, and update tables in existing translation paths based on the modifications. For example, the tables can be updated by copying data to map or link tables in the modified translation paths. In some embodiments, any number of tables associated with a first virtual memory address can be copied to tables associated with a second virtual memory address. Thus, the data used to translate a virtual memory address to a physical address can be copied.

At block 210, the modifier 128 can detect a defect in the execution of the test template by the circuit. For example, the modifier 128 can detect that a circuit or circuit design returns an incorrect or unexpected value in response to executing an instruction that references a modified translation path. In some embodiments, the defect can include returning a value that differs from the value stored in a physical memory address linked to the modified translation path.

At block 212, the modifier 128 can modify the circuit to prevent the defect during execution of the test template. For example, the modifier 128 can modify the design of a circuit so that the circuit accesses the correct physical memory address based on the modified translation path.

The process flow diagram of FIG. 2 is not intended to indicate that the operations of the method 200 are to be executed in any particular order, or that all of the operations of the method 200 are to be included in every case. Additionally, the method 200 can include any suitable number of additional operations. For example, the modifier 128 can store data related to a circuit test in a database. In some examples, any number of instructions that modify translation paths, instructions that are executed to detect defects in a circuit, translation paths, modified virtual memory addresses, and physical memory addresses linked to modified virtual memory addresses, among others, can be stored in a database. Furthermore, in some examples, the predetermined modification can be based on constraints associated with a translation path. For example, the constraints may include a maximum number of virtual memory addresses that can be stored in a table in a translation path, and the like. Moreover, the modified translation path can include a table that is modified to link to an alternate or new physical memory address.

Figure 3:
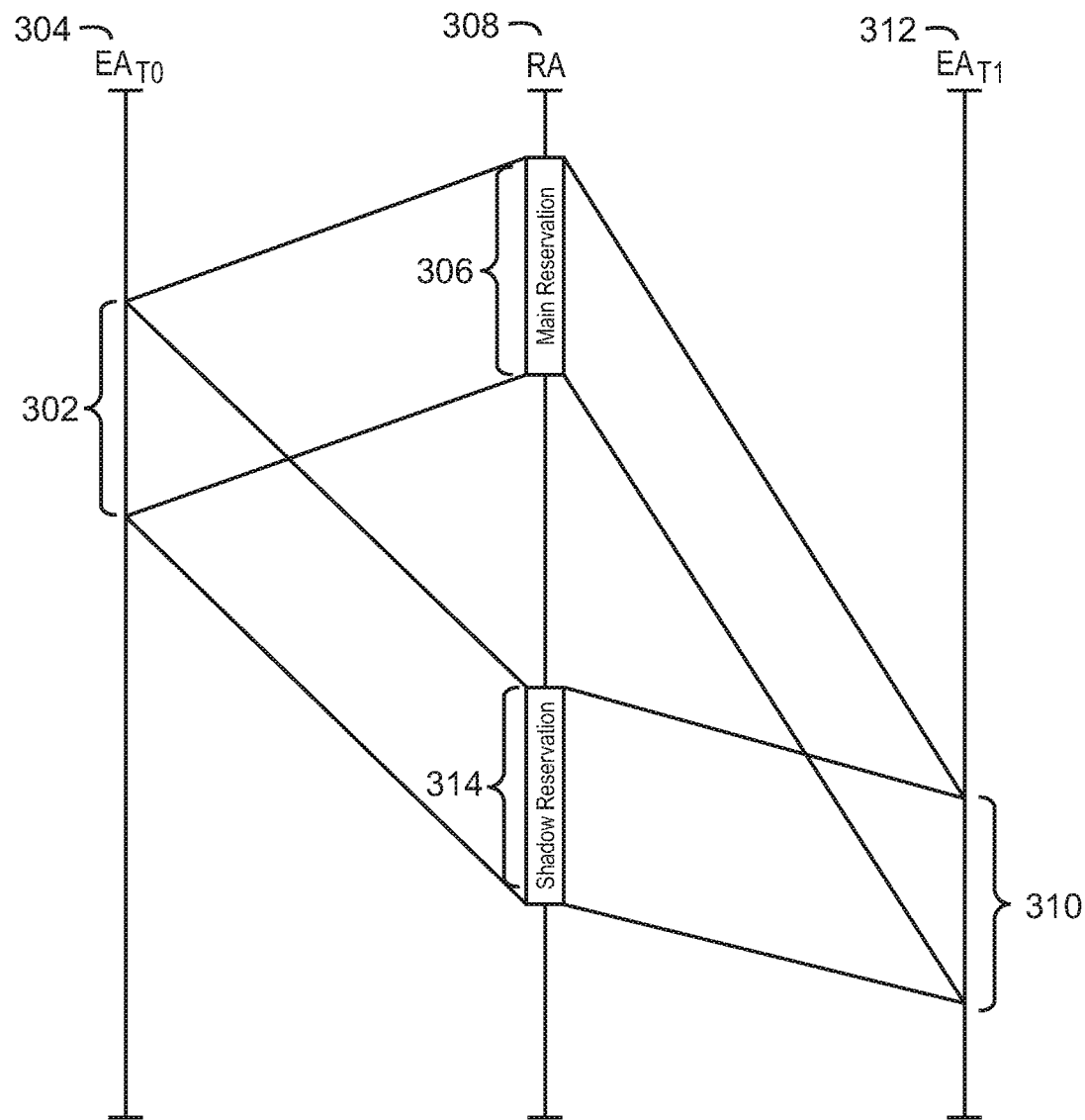
FIG. 3 is an example illustration of a modified translation path.

FIG. 3 is an example illustration of a modified translation path. The modified translation path can be generated with any suitable computing device such as computing device 100 of FIG. 1.

In some embodiments, a translation path 300 can include a link from a first set of virtual memory addresses 302 in a first table 304 (also referred to herein as EA-T0) to a set of physical memory addresses 306 (also referred to herein as main reservation) in a second table 308 (also referred to herein as RA). The set of physical memory addresses 306 can also be linked or mapped to a second set of virtual memory addresses 310 in a third table 312 (also referred to herein as EA-T1). In some embodiments, the translation path 300 can be modified so that the first set of virtual memory addresses 302 in the first table 304 are linked or mapped to an alternate set of memory addresses 314 (also referred to herein as a shadow reservation). In some embodiments, the alternate set of memory addresses in the second table 308 can map to the same virtual memory addresses 310 in the third table 312 as the set of physical memory addresses 306 in the second table 308.

It is to be understood that the modification of a translation path in FIG. 3 is only an example. The translation paths can be modified in any suitable number of ways.

Figure 4:
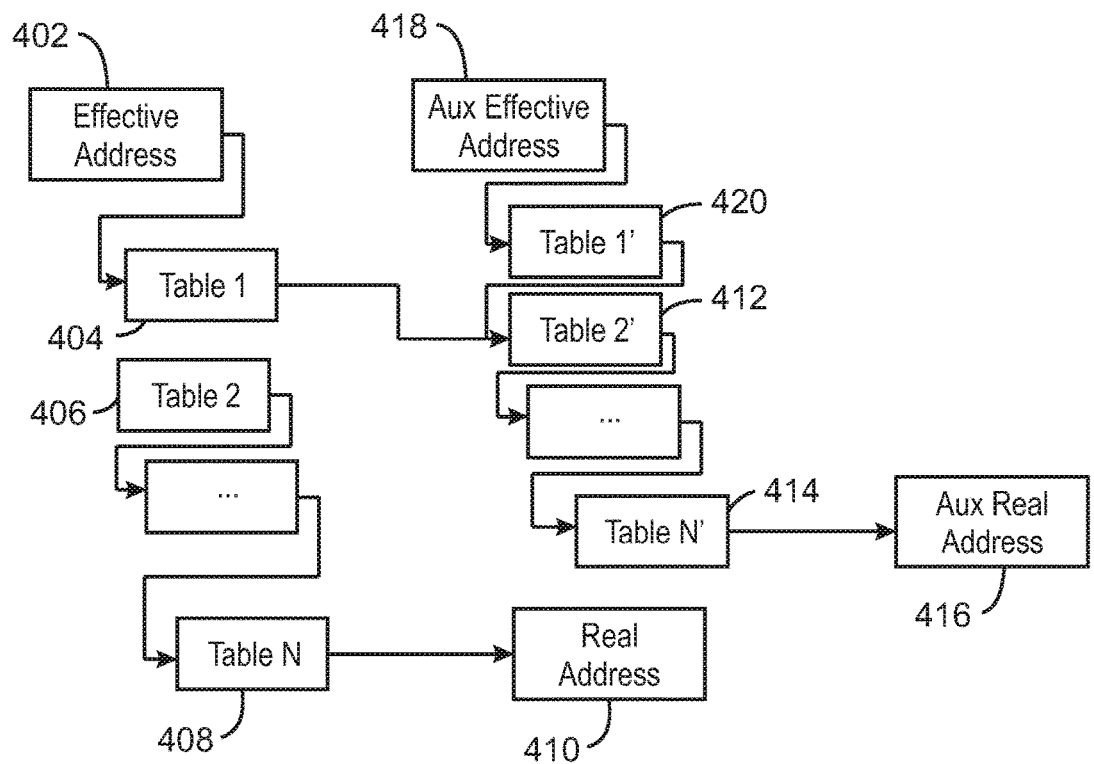
FIG. 4 is an example illustration of a modified translation path.

FIG. 4 is an example illustration of a modified translation path. The modified translation path can be generated with any suitable computing device such as computing device 100 of FIG. 1.

In some embodiments, the translation path 400 can include a virtual memory address 402 (also referred to herein as an effective address) that can map or link to any number of tables such as table 1 404, table 2 406, through table N 408. In some examples, any suitable number of tables can link to each other between table 2 406 and table N 408. Table N 408 can link to one or more physical memory addresses (also referred to herein as a real address) 410. In some embodiments, the translation path 400 can be modified so that the virtual memory address 402 is no longer linked to data stored in the real or physical address 410. For example, table 1 404 can be linked to table 2' 412 rather than table 2 406. Table 2' can be linked through any suitable number of tables to table N' 414, which can be linked or mapped to an auxiliary or alternate real address 416. The alternate real address 416 can be any suitable physical memory address that can store data. The modified translation path 400 can then return data values stored in the auxiliary real address 416 when instructions including the effective address 402 are executed. In some embodiments, an auxiliary effective address 418 can also link or map to the data stored in the auxiliary real address 416 through table 1' 420, table 2' 412, and table N' 414.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 5:
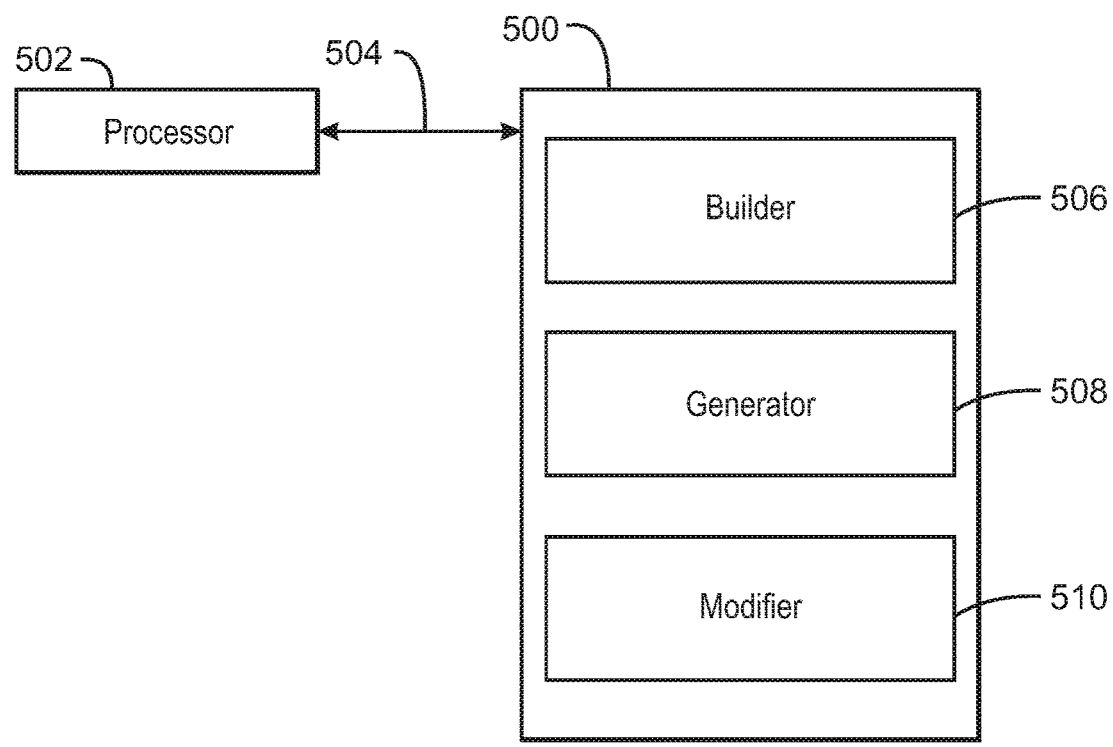
FIG. 5 is a tangible, non-transitory computer-readable medium that can modify a circuit according to an embodiment described herein.

Referring now to FIG. 5, a block diagram is depicted of an example of a tangible, non-transitory computer-readable medium that can modify a circuit. The tangible, non-transitory, computer-readable medium 500 may be accessed by a processor 502 over a computer interconnect 504. Furthermore, the tangible, non-transitory, computer-readable medium 500 may include code to direct the processor 502 to perform the operations of the current method.

The various software components discussed herein may be stored on the tangible, non-transitory, computer-readable medium 500, as indicated in FIG. 5. For example, a builder 506 can generate a set of testing data, wherein the set of testing data comprises at least a first virtual memory address corresponding to a first set of tables and a first physical memory address, and a second virtual memory address corresponding to a second set of tables and a second physical memory address. The builder 506 can also detect a predetermined modification to a translation path corresponding to a memory address mapping, wherein the predetermined modification can change a first physical memory address associated with a first physical memory address to a second physical memory address. Additionally, a generator 508 can generate a test template comprising a first instruction to implement the predetermined modification and a second instruction comprising the second physical memory address in the translation path. The generator 508 can also transmit the test template to the circuit for each of a plurality of software instruction threads. In some embodiments, a modifier 510 can detect a defect in the execution of the test template by the circuit and modify the circuit to prevent the defect during execution of the test template.

It is to be understood that any number of additional software components not shown in FIG. 5 may be included within the tangible, non-transitory, computer-readable medium 500, depending on the specific application.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for modifying a circuit comprising:
a processor to:
generate a set of testing data, the set of testing data comprising at least a first virtual memory address corresponding to a first set of tables and a first physical memory address, and a second virtual memory address corresponding to a second set of tables and a second physical memory address;
detect a predetermined modification to a translation path corresponding to a memory address mapping, the predetermined modification to change the first physical memory address associated with the first virtual memory address to the second physical memory address;
generate a test template comprising a first instruction to implement the predetermined modification and a second instruction comprising the second physical memory address in the translation path;
transmit the test template to the circuit for each of a plurality of software instruction threads;
detect a defect in the execution of the test template by the circuit; and
modify the circuit to prevent the defect during execution of the test template.

2. The system of claim 1, wherein the processor is to modify properties of the translation path, the properties comprising a page size or a caching property.

3. The system of claim 1, wherein the translation path comprises a mapping from a range of virtual memory addresses to a range of physical memory addresses.

4. The system of claim 3, wherein the mapping from the range of virtual memory addresses to the range of physical memory addresses corresponds to a translation look aside buffer.

5. The system of claim 1, wherein the processor is to:
   detect a result from the execution of the second instruction; and
   determine that the result corresponds to an unexpected value that differs from a value stored at the second physical memory address.

6. The system of claim 1, wherein the processor is to store the first instruction, the second instruction, the translation path, and the set of testing data in a database.

7. The system of claim 1, wherein the processor is to generate the predetermined modification based on constraints associated with the translation path.

8. The system of claim 1, wherein the first instruction is an atomic instruction comprising a semaphore.

9. A method for modifying a circuit comprising:
   generating a set of testing data, the set of testing data comprising at least a first virtual memory address corresponding to a first set of tables and a first physical memory address, and a second virtual memory address corresponding to a second set of tables and a second physical memory address;
   detecting a predetermined modification to a translation path corresponding to a memory address mapping, the predetermined modification to change the first physical memory address associated with the first virtual memory address to the second physical memory address;
   generating a test template comprising a first instruction to implement the predetermined modification and a second instruction comprising the second physical memory address in the translation path;
   transmitting the test template to the circuit for each of a plurality of software instruction threads;
   detecting a defect in the execution of the test template by the circuit; and
   modifying the circuit to prevent the defect during execution of the test template.

10. The method of claim 9, comprising modifying properties of the translation path, the properties comprising a page size or a caching property.

11. The method of claim 9, wherein the translation path comprises a mapping from a range of virtual memory addresses to a range of physical memory addresses.

12. The method of claim 11, wherein the mapping from the range of virtual memory addresses to the range of physical memory addresses corresponds to a translation look aside buffer.

13. The method of claim 9, wherein detecting the defect comprises:
   detecting a result from the execution of the second instruction; and
   determining that the result corresponds to an unexpected value that differs from a value stored at the second physical memory address.

14. The method of claim 9, comprising generating the predetermined modification based on constraints associated with the translation path.

15. A computer program product for modifying a circuit, the computer program product comprising a computer readable storage medium having program instructions embodied therewith, wherein the computer readable storage medium is not a transitory signal per se, the program instructions executable by a processor to cause the processor to:
   generate a set of testing data, the set of testing data comprising at least a first virtual memory address corresponding to a first set of tables and a first physical memory address, and a second virtual memory address corresponding to a second set of tables and a second physical memory address;
   detect a predetermined modification to a translation path corresponding to a memory address mapping, the predetermined modification to change the first physical memory address associated with the first physical memory address to the second physical memory address;
   generate a test template comprising a first instruction to implement the predetermined modification and a second instruction comprising the second physical memory address in the translation path;
   transmit the test template to the circuit for each of a plurality of software instruction threads;
   detect a defect in the execution of the test template by the circuit; and
   modify the circuit to prevent the defect during execution of the test template.

16. The computer program product of claim 15, wherein the program instructions cause the processor to modify properties of the translation path, the properties comprising a page size or a caching property.

17. The computer program product of claim 15, wherein the program instructions cause the processor to map from a range of virtual memory addresses to a range of physical memory addresses.

18. The computer program product of claim 17, wherein the mapping from the range of virtual memory addresses to the range of physical memory addresses corresponds to a translation look aside buffer.

19. The computer program product of claim 15, wherein the program instructions cause the processor to:
   detect a result from the execution of the second instruction; and
   determine that the result corresponds to an unexpected value that differs from a value stored at the second physical memory address.

20. The computer program product of claim 15, wherein the program instructions cause the processor to generate the predetermined modification based on constraints associated with the translation path.

\* \* \* \* \*